(12) United States Patent
Li et al.

(10) Patent No.: US 9,153,667 B2
(45) Date of Patent: Oct. 6, 2015

(54) METHOD FOR MAKING THIN FILM TRANSISTOR (71) Applicants: Tsinghua University, Beijing (CN); HON HAI PRECISION INDUSTRY CO., LTD., New Taipei (TW)

(72) Inventors: Qun-Qing Li, Beijing (CN); Xue-Shen Wang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 64 days.

(21) Appl. No.: 14/059,753

(22) Filed: Oct. 22, 2013

(65) Prior Publication Data

US 2014/0051215 A1 Feb. 20, 2014

Related U.S. Application Data (63) Continuation of application No. 12/384,241, filed on Apr. 2, 2009, now Pat. No. 8,597,990.

(30) Foreign Application Priority Data

May 23, 2008 (CN) .......................... 2008 1 0067425

(51) Int. Cl.
*H01L 21/00* (2006.01)
*H01L 29/66* (2006.01)
(Continued)

(52) U.S. Cl.
CPC ............ *H01L 29/6675* (2013.01); *B82Y 10/00* (2013.01); *H01L 29/0665* (2013.01); *H01L 29/0673* (2013.01); *H01L 51/0541* (2013.01); *B82Y 40/00* (2013.01); *H01L 51/0012* (2013.01); *H01L 51/0048* (2013.01)

(58) Field of Classification Search
None
See application file for complete search history.

(56) References Cited

U.S. PATENT DOCUMENTS 7,323,730 B2 * 1/2008 Borghetti et al. ............. 257/290
7,399,400 B2 * 7/2008 Soundarrajan et al. .... 205/777.5

(Continued)

FOREIGN PATENT DOCUMENTS

JP 2006-22818 * 8/2006
JP 2006-228818 * 8/2006

OTHER PUBLICATIONS

"High-mobility carbon-nanotube thin-film transistors on a polymeric substrate" E. S. Snow et al. Jan. 2005.*

(Continued)

*Primary Examiner* — Charles Garber
*Assistant Examiner* — Evren Seven
(74) *Attorney, Agent, or Firm* — Novak Druce Connolly Bove + Quigg LLP (57) ABSTRACT A method for making a thin film transistor, the method comprising: applying a gate electrode on an insulating substrate; covering the gate electrode with an insulating layer; forming a carbon nanotube layer on a growing substrate, wherein the carbon nanotube layer comprises a plurality of carbon nanotubes; transfer printing the carbon nanotube layer from the growing substrate onto the insulating layer, wherein the insulating layer insulates the carbon nanotube layer from the gate electrode; and placing a source electrode and a drain electrode spaced from each other and electrically connected to two opposite ends of at least one of the plurality of carbon nanotubes.

16 Claims, 6 Drawing Sheets (51) Int. Cl.
   *B82Y 10/00* (2011.01)
   *H01L 29/06* (2006.01)
   *H01L 51/05* (2006.01)
   *H01L 51/00* (2006.01)
   *B82Y 40/00* (2011.01)

(56) References Cited

U.S. PATENT DOCUMENTS

| | | | | |
|---|---|---|---|---|
| 7,812,342 | B2 * | 10/2010 | Lee et al. | 257/40 |
| 2005/0231855 | A1 * | 10/2005 | Tran | 360/324.1 |
| 2005/0279987 | A1 * | 12/2005 | Star et al. | 257/9 |
| 2008/0042287 | A1 * | 2/2008 | Furukawa et al. | 257/758 |
| 2008/0252202 | A1 * | 10/2008 | Li et al. | 313/504 |
| 2009/0159996 | A1 * | 6/2009 | Chow et al. | 257/415 |
| 2009/0166686 | A1 * | 7/2009 | Hunt et al. | 257/288 |
| 2009/0223564 | A1 * | 9/2009 | Chen | 136/261 |
| 2009/0224230 | A1 * | 9/2009 | Pesetski et al. | 257/24 |
| 2009/0258448 | A1 * | 10/2009 | Xiao et al. | 438/20 |
| 2009/0272967 | A1 * | 11/2009 | Afzali-Ardakani et al. | 257/40 |
| 2010/0028960 | A1 * | 2/2010 | Davis et al. | 435/131 |
| 2010/0065818 | A1 * | 3/2010 | Kim et al. | 257/14 |

OTHER PUBLICATIONS

"Patterned Carbon Nanotube Thin-Film Transistors with Transfer-Print Assembly" V. K. Sangwan et al. Jun. 2005.*
"Low-Temperature Growth of Carbon Nanotube by Plasma-Enhanced Chemical Vapor Deposition using Nickel Catalyst" Ryu et al. Jan. 2003.*
"Building Carbon Nanotube Transistors" IBM, Dec. 2204.*
"Building Carbon Nanotube Transistors," by IBM, published Dec. 16, 2004.*
"Low-Temperature Growth of Carbon Nanotube by Plasma-Enhanced Chemical Vapor Deposition using Nickel Catalyst" by Ryu et al. published Jun. 2003.*
"Extreme bendability of single-walled carbon nanotube networks transferred from hightemperature growth substrates to plastic and their use in thin-film transistors" by Hur et al. published Jun. 2005.*
"Patterned Carbon Nanotube Thin-Film Transistors with Transfer-Print Assembly" by Sangwan et al. published Jun. 2007.*

* cited by examiner

FIG. 6

METHOD FOR MAKING THIN FILM TRANSISTOR

RELATED APPLICATIONS

This application is a continuation application of U.S. patent application Ser. No. 12/384,241, filed on Apr. 2, 2009, entitled "METHOD FOR MAKING THIN FILM TRANSISTOR," which claims all benefits accruing under 35 U.S.C. §119 from China Patent Application No. 200810067425.9, filed on May 23, 2008 in the China Intellectual Property Office, disclosure of which is incorporated herein by reference.

BACKGROUND

1. Technical Field

The present disclosure relates to methods for making thin film transistors and, particularly, to a method for making a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs switching by modulating the number of carriers accumulated in the interface between the insulation layer and the semiconducting layer from an accumulation state to a depletion state, with applied voltage to the gate electrode, to change the amount of current passing between the drain electrode and the source electrode. In practical use, a high carrier mobility affect by the material of the semiconducting layer of the thin film transistor is desired.

Usually, the material of the semiconducting layer is amorphous silicone (a-Si), poly-silicone (p-Si), or organic semiconducting material. The carrier mobility of an a-Si TFT is relatively lower than a p-Si TFT. However, the method for making the p-Si TFT is complicated and costly. The organic TFT is flexible but has low carrier mobility.

Carbon nanotubes (CNTs) are a novel carbonaceous material and have received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by small differences in the diameter and chirality affect. The carrier mobility of semiconducting carbon nanotubes along a length direction thereof can reach about 1000 to 1500 $cm^2V^{-1}s^{-1}$. Thus, TFTs adopting semiconducting carbon nanotubes as a semiconducting layer have been produced.

Methods for making carbon nanotube based TFTs include dispersing an amount of carbon nanotube powder in an organic solvent to form a mixture; printing the mixture on a substrate; volatilizing the organic solvent to achieve a carbon nanotube layer on the substrate; forming a source electrode and a drain electrode on the carbon nanotube layer; forming a silicon nitride layer on the carbon nanotube layer; and forming a gate electrode on the insulating layer.

However, there are problems with the present carbon nanotube based TFTs. Firstly, the carbon nanotubes are prone to aggregate in the mixture. Thus, the carbon nanotubes cannot be uniformly dispersed in the carbon nanotube layer. Secondly, the organic solvent is hard to eliminate from the carbon nanotube layer resulting in impurities in the carbon nanotube layer. Thirdly, metallic carbon nanotubes are formed in the carbon nanotube layer, which should be eliminated but is difficult to do. Additionally, the carbon nanotube layer formed by the printing method is inflexible. Accordingly, the TFT is inflexible.

What is needed, therefore, is a method for making the thin film transistor in which the above problems are eliminated or at least alleviated.

BRIEF DESCRIPTION OF THE DRAWINGS

Many aspects of the present method for making the thin film transistor can be better understood with references to the following drawings. The components in the drawings are not necessarily drawn to scale, the emphasis instead being placed upon clearly illustrating the principles of the present method for making the carbon nanotube based thin film transistor.

Corresponding reference characters indicate corresponding parts throughout the several views. The exemplifications set out herein illustrate at least one embodiment of the present method for making the thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present method for making the thin film transistor.

Figure 1:
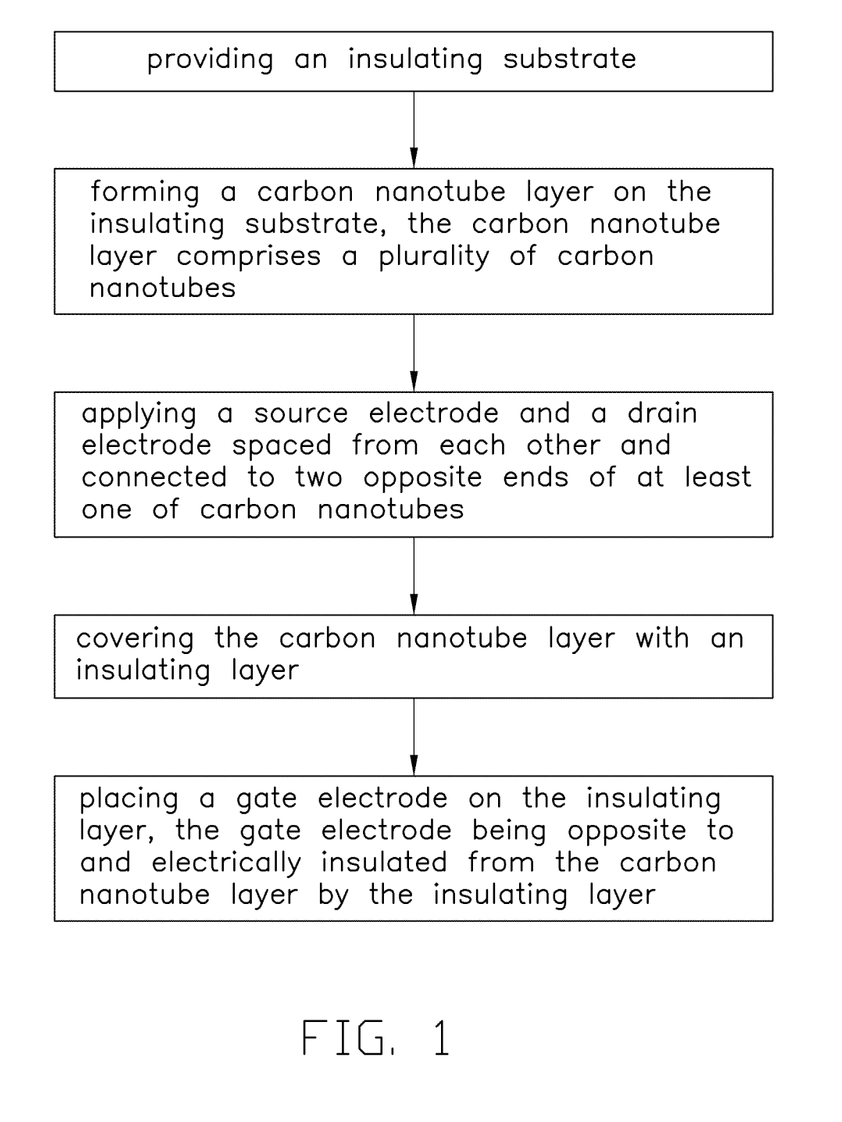
FIG. 1 is a flow chart of a method for making a thin film transistor in accordance with a first embodiment.
Figure 2:
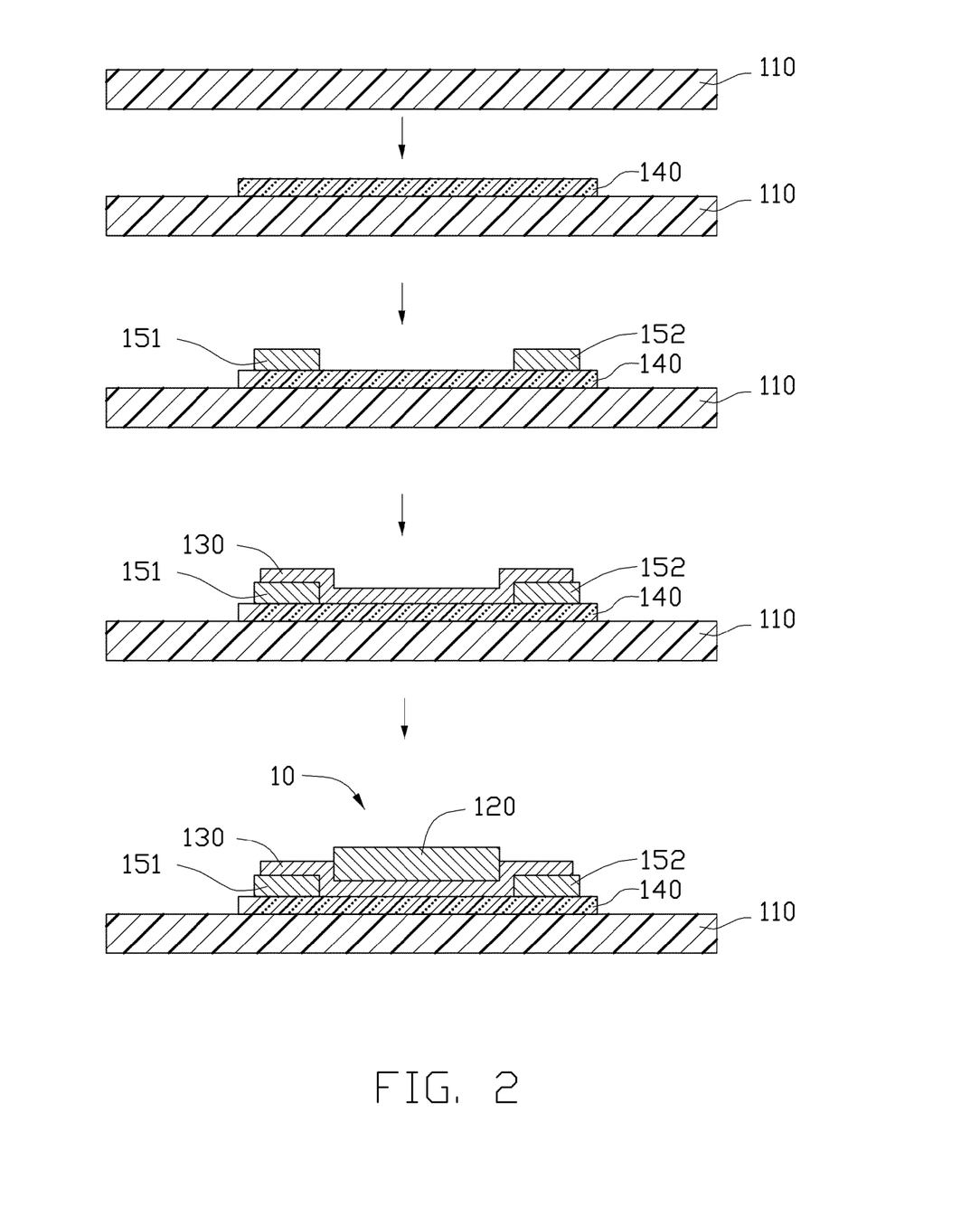
FIG. 2 is a schematic view of the method for making the thin film transistor of FIG. 1.

Referring to FIG. 1 and FIG. 2, a method for making a thin film transistor 10 having a top gate structure is provided in a first embodiment, and includes the following steps:

(a) providing an insulating substrate 110;

(b) forming a carbon nanotube layer 140 on the insulating substrate 110, the carbon nanotube layer 140 including a plurality of carbon nanotubes;

(c) applying a source electrode 151 and a drain electrode 152 spaced from each other and connected to two opposite ends of at least one of carbon nanotubes;

(d) covering the carbon nanotube layer 140 with an insulating layer 130; and (e) placing a gate electrode 120 on the insulating layer 130, the gate electrode 120 being opposite to and electrically insulated from the carbon nanotube layer 140 by the insulating layer 130.

In step (a), the surface of the insulating substrate 110 is substantially flat and smooth, and the material of the insulating substrate 110 is durable at high temperatures. The material can be selected as desired. The melting temperature of the material of the insulating substrate 110 can be higher than the growing temperature of the carbon nanotubes in step (b) (e.g., >500° C.). In other embodiments, the material of the insulating substrate 110 can be the same as that used for a substrate of printed circuit boards (PCB). The shape of the insulating substrate 110 is arbitrary, e.g., square, round. The size of the insulating substrate 110 is arbitrary. In the present embodiment, the insulating substrate 110 is square, and a length and a width of the insulating substrate 110 are 3 centimeters.

Step (b) can be executed by forming a carbon nanotube array on the insulating substrate 11, and treating the carbon nanotube array to form a carbon nanotube layer. Step (b) can also be executed by directly forming a carbon nanotube layer on the insulating substrate 110.

Specifically, step (b) can include the following steps of: (b1) forming a strip-shaped catalyst film on the insulating substrate 110, a width of the strip-shaped catalyst film ranging from about 1 micrometer to about 20 micrometers; (b2) growing a strip-shaped carbon nanotube array on the insulating substrate 110; and (b3) causing the strip-shaped carbon nanotube array to fold along a direction parallel to a surface of the insulating substrate 110, thus forming the carbon nanotube layer 140.

In step (b1), the strip-shaped catalyst film is used to grow carbon nanotubes. A material of the strip-shaped catalyst film can be selected from iron, cobalt, nickel, and any combination thereof. In this embodiment, the material of the strip-shaped catalyst film is iron. The strip-shaped catalyst film can be formed by a thermal deposition method, an electron beam deposition method, or a sputtering method. The strip-shaped catalyst film can also be formed using a light erosion method or a masking method. A length of the strip-shaped catalyst film is not limited. A thickness of the strip-shaped catalyst film ranges from about 0.1 nanometers to about 10 nanometers. The length of the catalyst film can be at least 20 times the width. In the present embodiment, the width of the strip-shaped catalyst film ranges from about 1 micrometer to about 20 micrometers.

Step (b2) can be executed by a chemical vapor deposition method, and can include the following steps of: (b21) placing the insulating substrate 110 with the a strip-shaped catalyst film thereon into a chamber; (b22) introducing a protective gas to discharge the air in the chamber; (b23) heating the chamber to a temperature ranging from about 600° C. to about 900° C. with the protective gas therein and sustaining the predetermined temperature; and (b24) introducing a gas mixture with a ratio of carbon source gas and carrying gas ranging from 1:30 to 1:3 for 5 to 30 minutes to grow the strip-shaped carbon nanotube array. Step (b2) can further include a step (b25) of ceasing the heating of the chamber, and removing the substrate with the strip-shaped carbon nanotube array thereon once the substrate has cooled to room temperature.

The protective gas can be made up of nitrogen ($N_2$), ammonia ($NH_3$), and/or a noble gas. The carbon source gas can be a hydrocarbon gas, such as ethylene ($C_2H_4$), methane ($CH_4$), acetylene ($C_2H_2$), ethane ($C_2H_6$), or any combination thereof. The carrying gas can be hydrogen gas.

Flow of the carbon source gas can range from about 20 to about 200 sccm. Flow of the carrying gas can range from about 50 to about 600 sccm. The protective gas is continuously introduced until the temperature of the chamber reaches room temperature to prevent oxidation of the carbon nanotubes. In the present embodiment, the protective gas is argon gas, and the carbon source gas is acetylene. A temperature of the chamber for growing a carbon nanotube array is about 800° C. The gas mixture is introduced for about 60 minutes.

The properties of the carbon nanotubes in the strip-shaped carbon nanotube array, such as diameters thereof, and the properties of the carbon nanotube layer, such as, transparency and resistance thereof can be adjusted by regulating the ratio of the carbon source gas and carrier gas. In the present embodiment, a single-walled carbon nanotube array can be prepared when the ratio of the carbon source gas and the carrier gas ranges from about 1:100 to about 10:100. A double-walled or multi-walled carbon nanotube array can be acquired when the ratio of the carbon source gas and the carrier gas is increased. The carbon nanotubes in the carbon nanotube array can be single-walled carbon nanotubes, double-walled carbon nanotubes or combination thereof. Diameters of the single-walled carbon nanotubes range from about 0.5 to about 50 nanometers. Diameters of the double-walled carbon nanotubes range from about 1 to about 50 nanometers. In the present embodiment, the diameter of the carbon nanotubes in the carbon nanotube layer 140 is less than about 10 nanometers. The carbon nanotubes can be single-walled carbon nanotubes. A thickness of the carbon nanotube layer 140 is in the range from about 0.5 nanometers to about 100 microns.

Height of the strip-shaped carbon nanotube array increases with increase in the time the gas mixture is introduced. In the present embodiment, the height of the strip-shaped carbon nanotube array ranges from about 1 millimeter to about 10 millimeters. The height of the carbon nanotube array can range from about 1 millimeter to about 2 millimeters when the gas mixture is introduced for 60 minutes.

The strip-shaped carbon nanotube array formed under the above conditions is essentially free of impurities such as carbonaceous or residual catalyst particles. The carbon nanotubes in the strip-shaped carbon nanotube array are closely packed together by van der Waals attractive force therebetween.

Step (b3) can be executed using an organic solvent treating method, a mechanical force treating method, or an air current treating method. Step (b3), when executed using the organic solvent treating method, includes the following steps of: (b31) immersing the insulating substrate with the strip-shaped carbon nanotube array thereon into organic solvent; and (b32) taking out the insulating substrate from the organic solvent along a direction parallel to a surface of the insulating substrate. The strip-shaped carbon nanotube array is pressed down on the substrate because of the weight and surface tension of the organic solvent to form the carbon nanotube film segment. The organic solvent can be ethanol, methanol, acetone, chloroform, or dichloroethane. In the present embodiment, the organic solvent is ethanol. The carbon nanotube film segment is adhered on the surface of the substrate, and has a reduced specific surface area. The mechanical strength and toughness of the carbon nanotube film segment are increased, while, the adhesiveness thereof is reduced.

Step (b3), when executed using the mechanical force treating method, includes the following steps of: (b31') providing a pressing device; and (b32') pressing the strip-shaped carbon nanotube array along the direction parallel to the surface of the insulating substrate by the pressing device.

The pressing device can be a pressure head with a smooth surface. In the present embodiment, the pressure head is a roller-shaped pressure head. It can be understood that any pressing device that can press the strip-shaped carbon nanotube array down on the substrate can be used as the pressing device.

Step (b3), when executed using the air current treating method, includes the following steps of: (b31") supplying an air-blowing device; and (b32") applying an air current by the air blowing device to the strip-shaped carbon nanotube array along a direction parallel to the surface of the insulating substrate, causing the strip-shaped carbon nanotube array to be pressed down on the insulating substrate and forming the carbon nanotube film segment. The air-blowing device can be any device that can produce an air current. In the present embodiment, the air-blowing device is a Fan.

A density of the carbon nanotube film segment is related to a width of the strip-shaped catalyst film. The greater the width of the strip-shaped catalyst film, the greater the density of the carbon nanotube film segment. Whereas, the smaller the width of the strip-shaped catalyst film, the smaller the density of the carbon nanotube film segment. In the present embodiment, the width of the carbon nanotube layer 140 formed by the carbon nanotube film segment ranges from about 1 micrometer to about 20 micrometers.

Figure 3:
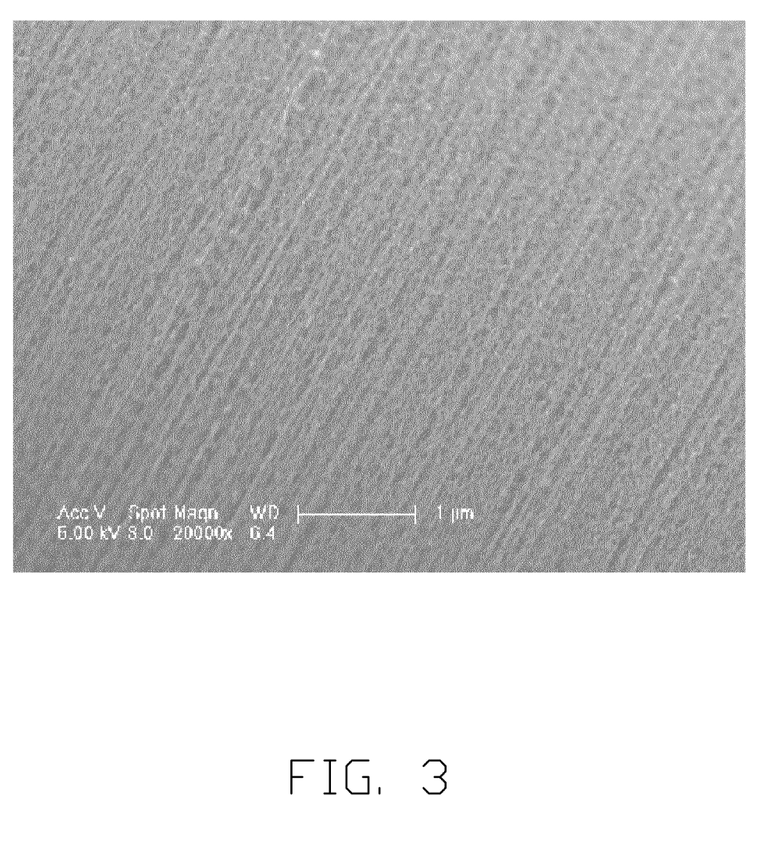
FIG. 3 shows a Scanning Electron Microscope (SEM) image of a carbon nanotube layer used in the thin film transistor of FIG. 1.

Referring to FIG. 3, the carbon nanotube layer 140 includes a plurality of carbon nanotubes arranged in a preferred orientation. The carbon nanotubes are parallel with each other, nearly equal in length and are combined side by side by van der Waals attractive force therebetween. The length of the carbon nanotube layer 140 can be equal to the length of the carbon nanotubes, such that at least one carbon nanotube will span the entire length of the carbon nanotube layer 140. The length of the carbon nanotube layer 140 is only limited by the length of the carbon nanotubes.

It is to be understood that, due to the high growing temperature of the carbon nanotube layer 140 in step (b), the material of the insulating substrate 110 should be durable for high temperature. That is, the growing temperature restricts the material of the insulating substrate for forming the thin film transistor. For forming the thin film transistor on a substrate, especially on a flexible substrate, an additional transfer printing step (f) can be further provided after step (b).

The additional transfer printing step (f) includes following substeps of:

(f1) providing a transfer substrate (not shown);

(f2) placing the insulating substrate 110 with the carbon nanotube layer 140 on the transfer substrate and contacting the surface of the carbon nanotube layer 140 to the surface of the transfer substrate forming a sandwich structure;

(f3) pressing the sandwich structure for a period of time; and (f4) removing the insulating substrate 110.

The sandwich structure can be pressed in a hot pressing device (not shown) (e.g., between two hot rollers). The material of the transfer substrate can be flexible material such as plastic, polymer, such as PET, or resin. The temperature and pressing time for hot pressing are determined by the material of the transfer substrate (e.g., about 50 to 100° C. for 5 to 30 minutes for plastic, polymer, or resin).

It is noted that because the carbon nanotube layer 140 has a high purity and a high specific surface area, the carbon nanotube layer 140 is adherent in nature. As such, the carbon nanotube layer 140 can be directly adhered to the surface of the transfer substrate in step (f2). After pressed in step (f3), the carbon nanotube layer 140 will be firmly adhered on the surface of the transfer substrate. Due to the different materials of the transfer substrate and the insulating substrate 110, cohesion between each of the substrates and the carbon nanotube layer 140 are different. The material of the transfer substrate can be selected so that the cohesion between the transfer substrate and the carbon nanotube layer 140 is greater than that between the insulating substrate 110 and the carbon nanotube layer 140. Thus, the insulating substrate 110 can be peeled off from the sandwich structure easily, and thereby, the carbon nanotube layer 140 is transfer printed on the transfer substrate.

It can be understood that when the size of the carbon nanotube layer 140 is large, or when a plurality of thin film transistors is to be made, the carbon nanotube layer 140 can be etched or cut into a plurality of carbon nanotube layers 140 with a predetermined shape and size. The etching method is not limited.

In step (c) and step (e), the material of the source electrode 151, the drain electrode 152, and the gate electrode 120 has a good conductive property, and can be pure metals, metal alloys, indium tin oxide (ITO), antimony tin oxide (ATO), silver paste, conductive polymer, or metallic carbon nanotubes. A thickness of the source electrode 151, the drain electrode 152, and the gate electrode 120 is about 0.5 nanometers to 100 microns. A distance between the source electrode 151 and the drain electrode 152 is about 1 to 100 microns.

In one embodiment, when the source electrode 151, the drain electrode 152, and the gate electrode 120 are made of pure metals, metal alloys, indium tin oxide (ITO), or antimony tin oxide (ATO), a conducting layer can be formed by a depositing, sputtering, evaporating method, and etched to form the source electrode 151 and the drain electrode 152. In other embodiments, when the source electrode 151, the drain electrode 152, and the gate electrode 120 are made of silver paste or conductive polymer, the source electrode 151, the drain electrode 152 and the gate electrode 120 can be formed directly by a print method. In other embodiment, two carbon nanotube films with metallic carbon nanotube therein can be separately adhered on the substrate or the carbon nanotube layer 140 to form the source electrode 151 and the drain electrode 152, and can be adhered on the insulating layer 130 to form the gate electrode 120.

In the present embodiment, the source electrode 151 and the drain electrode 152 are separately formed on two ends of the carbon nanotube layer 140. The carbon nanotubes in the carbon nanotube layer 140 aligned along a direction from the source electrode 151 to the drain electrode 152 and two ends of part of carbon nanotubes are electrically connected to the source electrode 151 and the drain electrode 152, to form a carrier channel from the source electrode 151 to the drain electrode 152.

In the present embodiment, the material of the source electrode 151, the drain electrode 152, and the gate electrode 120 is pure metal, and steps (c) and (e) can be performed by a lift-off method or an etching method. The thickness of the source electrode 151 and the drain electrode 152 is about 1 micron. The distance between the source electrode 151 and the drain electrode 152 is about 50 microns.

It is to be understood that, to achieve a semiconducting layer, an additional step (g) of eliminating the metallic carbon nanotubes in the carbon nanotube layer 140 can be further provided. In one embodiment, the step (g) can be performed after step (b), by applying a voltage between the source electrode 151 and the drain electrode 152, to break down the metallic carbon nanotubes in the carbon nanotube layer 140, and thereby achieve a semiconducting layer free of metallic carbon nanotubes therein. The voltage is in a range from about 1 to about 1000 volts (V). In other embodiments, the step (f) can be performed after step (b) by irradiating the carbon nanotube layer 140 with a hydrogen plasma, microwave, terahertz (THz), infrared (IR), ultraviolet (UV), or visible light (Vis), to break down the metallic carbon nanotubes in the carbon nanotube layer 140, and thereby achieve a semiconducting layer free of metallic carbon nanotubes therein.

In step (d), the material of the insulating layer 130 can be a rigid material such as silicon nitride ($Si_3N4$) or silicon dioxide ($SiO_2$), or a flexible material such as PET, benzocyclobutenes (BCB), or acrylic resins. The insulating layer 130 can be formed by a depositing, sputtering, evaporating, or printing method according to the material thereof. A thickness of the insulating layer 130 can be in a range from 0.5 nanometers to 100 microns.

In the present embodiment, a $Si_3N_4$ insulating layer 130 is deposited on the carbon nanotube layer 140, the source electrode 151 and the drain electrode 152 are formed by a PECVD method. The thickness of the insulating layer 130 is about 1 micron.

To be used in a device (e.g., a display), the insulating layer 130 can be further etched to form exposure holes to expose a part of the source electrode 151, and the drain electrode 152.

A second embodiment for making the thin film transistor 10 having a top gate structure is provided. The method for making the thin film transistor 10 having a top gate structure is the same with the method in the first embodiment except that the carbon nanotube layer 140 is directly formed on the insulating substrate 110. Step (b) of the second embodiment includes the following steps of: (b1') providing a growing substrate (not shown) with a catalyst layer 318 located thereon; (b2') placing the growing substrate adjacent to the insulating substrate 110 in a chamber; and (b3') heating the chamber to a growth temperature for carbon nanotubes under a protective gas, and introducing a carbon source gas along a gas flow direction, growing a plurality of carbon nanotubes to form a carbon nanotube layer 140 on the insulating substrate 110.

In step (b1') the catalyst layer includes a layer of monodisperse catalyst. The method of forming the catalyst layer depends on the material of the monodisperse catalyst. When the catalyst is made of iron (Fe), cobalt (Co), nickel (Ni), or any alloy thereof, the process of forming the catalyst layer on the growing substrate can be a physical vapor deposition (PVD) method, a chemical vapor deposition (CVD) method, a coating method or a plating method. The process of forming the catalyst layer on the growing substrate can be executed by applying a monodisperse solution on the surface of the growing substrate to form a monodispersion solution layer, and drying the monodispersion solution layer to form a catalyst layer. In the present embodiment, the catalyst layer is made of a monodisperse solution of metal or metal-salt.

The material of the growing substrate is durable at high temperatures, but can otherwise be selected as desired. The melting temperature of the material of the growing substrate should be higher than the growing temperature of the carbon nanotubes in step (b3') (e.g., >800° C.). The size and shape of the growing substrate is arbitrary, e.g., square, round. In the present embodiment, the shape and the size of the growing substrate can be the same as the insulating substrate 110.

In step (b2'), the growing substrate and the insulating substrate 110 are located in sequence along a carbon nanotube growing direction (e.g., the growing substrate is located next to the insulating substrate 110). In step (b3'), after introducing the carbon source gas into the chamber, it starts to grow carbon nanotubes under the effect of the catalyst. One end (e.g., the root) of the carbon nanotubes is fixed on the growing substrate, and the other end (e.g., the top/free end) of the carbon nanotubes grow continuously. The density of the carbon nanotubes is low due to the catalyst layer including a plurality of monodisperse catalyst grains. Therefore, some of the carbon nanotubes grow into ultralong carbon nanotubes. Because the growing substrate is near an inlet of the introduced carbon source gas, the ultralong carbon nanotubes float above the insulating substrate 110 with the roots of the ultralong carbon nanotubes still sticking on the growing substrate, as the carbon source gas is continuously introduced into the chamber. The mechanism of growing ultralong carbon nanotubes can be called "kite-mechanism". The length of the ultralong carbon nanotubes depends on the growing time. After stop introducing the carbon source gas into the chamber, the ultralong carbon nanotubes stop growing and land on the insulating substrate 110. The ultralong carbon nanotubes fall down or are pushed onto the insulating substrate 110 parallel and separately due to the gravity to form a carbon nanotube film. The distance between any adjacent ultralong carbon nanotubes is more than 20 micrometers.

Further, in order to increase the density of the carbon nanotubes, a process of replacing a new growing substrate, or cleaning the original growing substrate and forming a new catalyst layer thereon can be executed to form another carbon nanotube film on the insulating substrate 110. Repeating this process, a plurality of carbon nanotube films are formed on the insulating substrate 110. The insulating substrate can rotate a certain angle, thus an angle α between the preferred orientation of the carbon nanotubes in the two adjacent carbon nanotube films so that $0° \leq \alpha \leq 90°$. The carbon nanotube film includes a plurality of carbon nanotubes parallel to each other, have an almost equal length and combined by van der Waals attractive therebetween. In the present embodiment, the carbon nanotube layer 140 includes at least one carbon nanotube film. If the size of the at least one carbon nanotube film grown by the present method is larger than size of the carbon nanotube layer 140, the at least one carbon nanotube film can be cut into desired size of the carbon nanotube layer 140.

Figure 4:
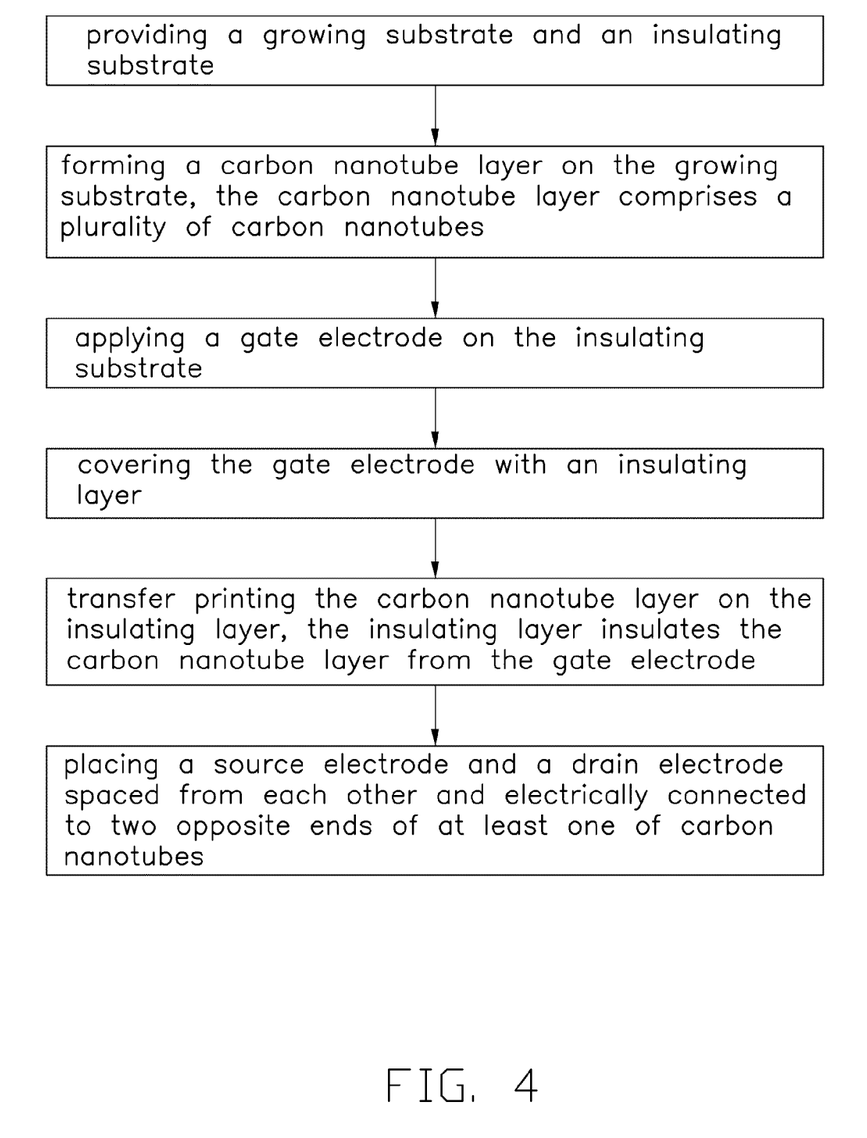
FIG. 4 is a flow chart of a method for making a thin film transistor in accordance with a second embodiment.
Figure 5:
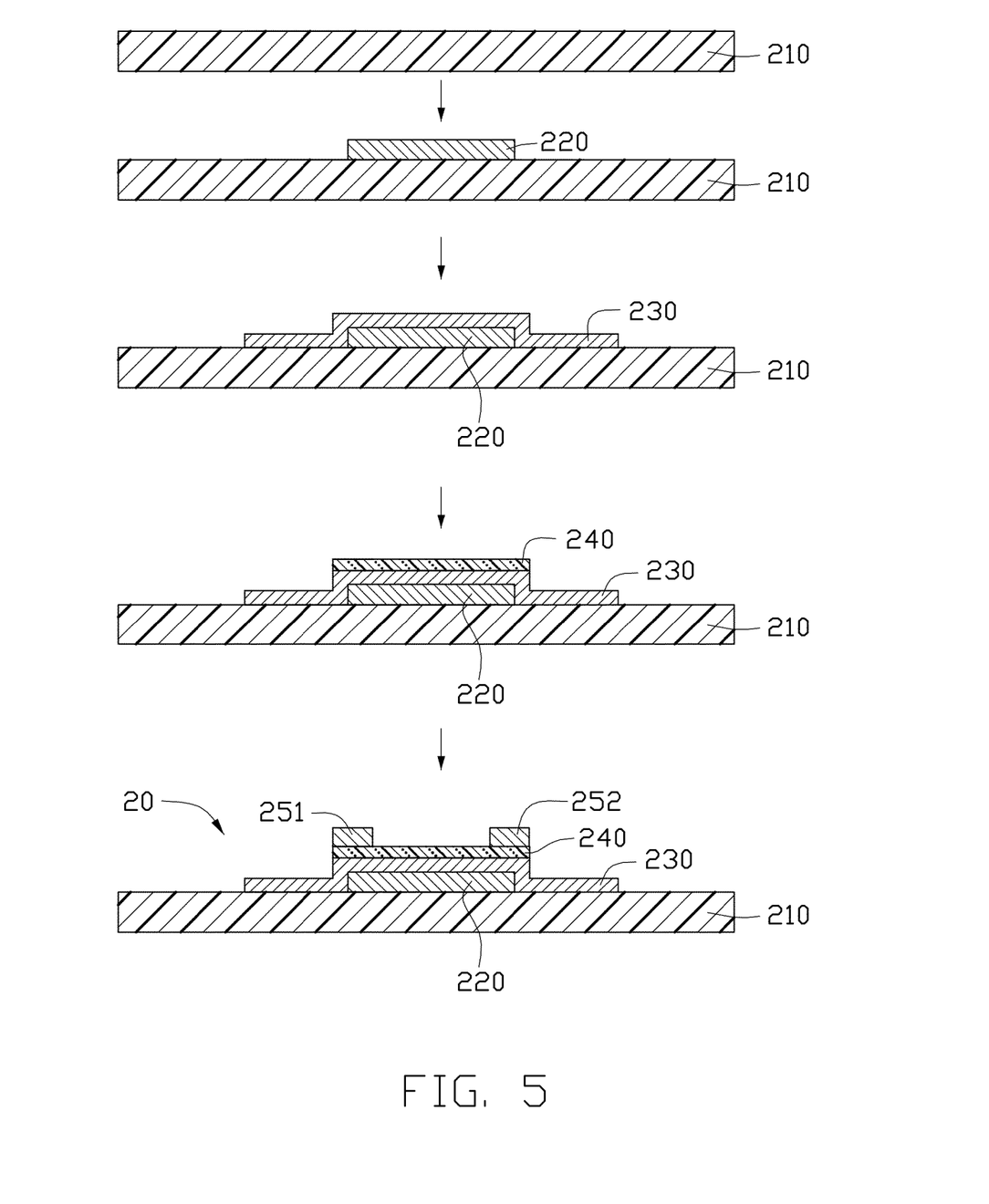
FIG. 5 is a schematic view of the method for making the thin film transistor of FIG. 4.

Referring to FIG. 4 and FIG. 5, a method for making the thin film transistor 20 having a bottom gate structure is provided in a third embodiment, and is substantially the same as the method for making the thin film transistor 10 in the first or second embodiment. The main difference between the two methods is that the thin film transistor 20 has a bottom gate structure.

The method for making the thin film transistor 20 includes steps of:

(a') providing a growing substrate and an insulating substrate;

(b') forming a carbon nanotube layer on the growing substrate, the carbon nanotube layer including a plurality of carbon nanotubes;

(c') applying a gate electrode on the insulating substrate;

(d') covering the gate electrode with an insulating layer; and (e') transfer printing the carbon nanotube layer on the insulating layer, the insulating layer insulates the carbon nanotube layer from the gate electrode;

(f') placing a source electrode and a drain electrode spaced from each other and electrically connected to two opposite ends of at least one of carbon nanotubes.

A method for making an array of thin film transistors is provided in a fourth embodiment, and is substantially the same as the method for making the thin film transistor 10 in the first or second embodiment. The main difference is that, in the fourth embodiment, a plurality of thin film transistors is formed on the same substrate, thereby achieving the array of thin film transistors.

Figure 6:
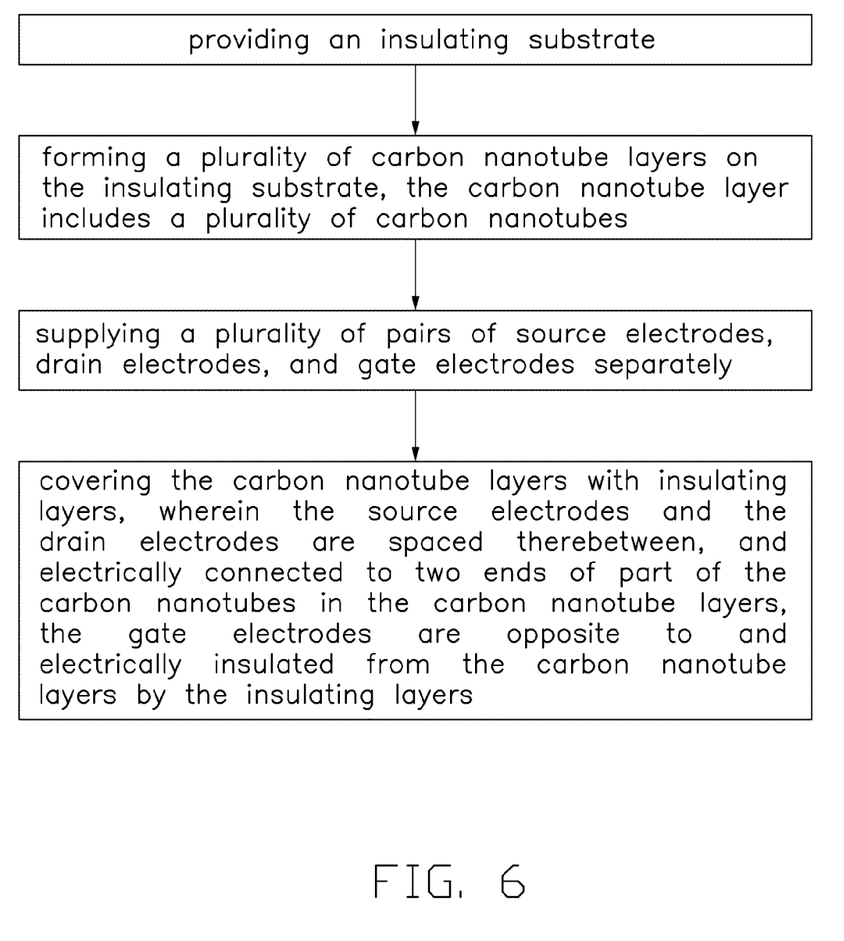
FIG. 6 is a flow chart of a method for making thin film transistors in accordance with a third embodiment.

Referring to FIG. 6, the method for making the array of thin film transistors includes steps of:

(a") providing an insulating substrate;

(b") forming a plurality of carbon nanotube layers on the insulating substrate, the carbon nanotube layer 140 includes a plurality of carbon nanotubes;

(c") supplying a plurality of pairs of source electrodes, drain electrodes, and gate electrodes separately; and (d") covering the carbon nanotube layers with insulating layers, wherein the source electrodes and the drain electrodes are spaced therebetween, and electrically connected to two ends of part of the carbon nanotubes in the carbon nanotube layers, the gate electrodes are opposite to and electrically insulated from the carbon nanotube layers by the insulating layers.

Step (b") can be executed by two methods. The first method includes the following steps of: forming one or more carbon nanotube layers with a large area on the insulating substrate; and patterning the carbon nanotube layer with a large area into a plurality of carbon nanotube layers with a small area, each carbon nanotube layer including a plurality of carbon nanotubes. The second method includes the following steps of: forming a plurality of strip-shaped catalyst films on the insulating substrate; growing a plurality of carbon nanotube arrays via chemical vapor deposition method; and treating the plurality of carbon nanotube arrays, thus forming a plurality of carbon nanotube layers.

In the first executed method of step (b"), the carbon nanotube layer with a large area can be patterned by etching or cutting with laser beam, to form a plurality of carbon nanotube layers at desired locations on the insulating substrate. In the second method of step (b"), the strip-shaped catalyst films can be formed by a thermal deposition method, an electron beam deposition method or a sputtering method. The strip-shaped catalyst films also can be formed by a light eroding method or a masking method. A distance between adjacent two strip-shaped catalyst films ranges from about 10 micrometers to about 15 millimeters.

In the present embodiment, an array of carbon nanotube strip-shaped catalyst films is formed on the insulating substrate at desired locations. The formed carbon nanotube layers are arranged along columns and rows. The plurality of carbon nanotube layers can be directly formed from the locations of the catalyst layer on the insulating substrate. Thus, the cutting or etching step of the carbon nanotube layer is needless.

In step (c"), a conductive layer can be formed on all the carbon nanotube layers, and patterned by an etching step to form a plurality of source electrodes and drain electrodes separately connected to two ends of the carbon nanotubes in the carbon nanotube layers. Further, when the insulating layers covers the carbon nanotube layers, another conductive layer can be formed on the entire insulating layers, and patterned by an etching step to form a plurality of gate electrodes opposite to the carbon nanotube layers.

In step (d"), an insulating layer can be formed on all the carbon nanotube layers, source electrodes and drain electrodes, and then patterned by an etching step to form a plurality of insulating layers corresponding to the carbon nanotube layers.

It is to be understood that, the array of thin film transistors can be formed in a similar way of the third embodiment. The method for forming the array of thin film transistors includes following steps of:

(a") providing an insulating substrate;

(b") forming a plurality of carbon nanotube layers on the insulating substrate, the carbon nanotube layer including a plurality of carbon nanotubes;

(c") placing a plurality of pairs of source electrode and drain electrode separately and each pair of source electrode and drain electrode is electrically connected to two opposite ends of at least one of carbon nanotubes in the corresponding carbon nanotube layer;

(d") covering the carbon nanotube layers with insulating layers; and (e") applying a plurality of gate electrodes on the insulating layer, the gate electrodes being opposite to and electrically insulated from the carbon nanotube layers by the insulating layers.

The method for making the thin film transistor provided in the present embodiments has the following superior properties. Firstly, the diameter and wall number of the carbon nanotubes can be controlled by the ratio of the carrier gas and the carbon source gas and thereby, achieve semiconducting carbon nanotubes. Thus, since the carbon nanotubes in the carbon nanotube layer are arranged along a preferred orientation, parallel with each other, two ends of at least one carbon nanotube are electrically connected to the source electrode and the drain electrode, and the carbon nanotubes also can arranged along a direction extending from the source electrode and the drain electrode, thus the carrier mobility of the thin film transistor using the carbon nanotube layer as a semiconductor layer is relatively high. Secondly, the carbon nanotubes in the carbon nanotube layer are parallel to each other and arranged along a preferred orientation to improve the toughness and flexibility of the carbon nanotube layer. Thus, the flexibility of the thin film transistor can be improved. Thirdly, the carbon nanotube layer is adhesive and can be easily adhered in a desired location at a low temperature (e.g., room temperature), thus the method for making the thin film transistor is relatively simple.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

What is claimed is:

1. A method for making a thin film transistor, the method comprising:

applying a gate electrode on an insulating substrate;

covering the gate electrode with an insulating layer;

forming a carbon nanotube layer on a growing substrate, wherein the carbon nanotube layer comprises a plurality of carbon nanotubes; and the forming the carbon nanotube layer comprises:

forming a strip-shaped catalyst film on the growing substrate;

placing the growing substrate with the strip-shaped catalyst film thereon into a chamber;

introducing a protective gas to discharge the air in the chamber;

heating the chamber to a temperature ranging from about 600° C. to 900° C. with the protective gas therein and sustaining the temperature;

introducing a gas mixture with a ratio of carbon source gas and carrying gas ranging from 1:30 to 1:3 for 5 to 30 minutes to grow a strip-shaped carbon nanotube array; and folding the strip-shaped carbon nanotube array along a direction parallel to a surface of the growing substrate;

transfer printing the carbon nanotube layer from the growing substrate onto the insulating layer, wherein the insulating layer insulates the carbon nanotube layer from the gate electrode; and placing a source electrode and a drain electrode spaced from each other and electrically connected to two opposite ends of at least one of the plurality of carbon nanotubes.

2. The method of claim 1, wherein a width of the strip-shaped catalyst film ranging from about 1 micrometer to about 20 micrometers.

3. The method of claim 1, wherein the folding the strip-shaped carbon nanotube array comprises:
immersing the growing substrate with the strip-shaped carbon nanotube array thereon into organic solvent; and
taking out the growing substrate from the organic solvent along the direction parallel to the surface of the growing substrate.

4. The method of claim 1, wherein the folding the strip-shaped carbon nanotube array comprises pressing the strip-shaped carbon nanotube array along the direction parallel to the surface of the growing substrate by a pressing device.

5. The method of claim 1, wherein the folding the strip-shaped carbon nanotube array comprises applying an air current by an air blowing device to the strip-shaped carbon nanotube array along the direction parallel to the surface of the substrate.

6. The method of claim 1, wherein the plurality of carbon nanotubes comprises semiconducting carbon nanotubes.

7. The method of claim 1, wherein the plurality of carbon nanotubes are substantially parallel to each other and joined side by side via van der Waals attractive force therebetween.

8. The method of claim 1, wherein the plurality of carbon nanotubes are arranged along an orientation extending from the source electrode to the drain electrode.

9. The method of claim 1, wherein the plurality of carbon nanotubes have the same length, and a dimension of the carbon nanotube layer along a direction extending from the source electrode to the drain electrode is equal to a length of the plurality of carbon nanotubes.

10. The method of claim 1, wherein the source electrode and the drain electrode are applied directly on the carbon nanotube layer.

11. The method of claim 1, wherein the forming the carbon nanotube layer further comprises eliminating metallic carbon nanotubes in the carbon nanotube layer.

12. The method of claim 11, wherein the eliminating metallic carbon nanotubes comprises applying a voltage to the source electrode and the drain electrode to break down the metallic carbon nanotubes in the carbon nanotube layer.

13. The method of claim 11, wherein the eliminating metallic carbon nanotubes comprises irradiating the carbon nanotube layer with a hydrogen plasma, microwave, terahertz, infrared, ultraviolet, or visible light to break down the metallic carbon nanotubes in the carbon nanotube layer.

14. A method for making thin film transistors, the method comprising:
forming a plurality of carbon nanotube layers on an insulating substrate, wherein each of the plurality of carbon nanotube layers comprises a plurality of carbon nanotubes; and the forming the plurality of carbon nanotube layers comprises:
forming a plurality of strip-shaped catalyst films on the insulating substrate;
placing the insulating substrate with the plurality of strip-shaped catalyst films thereon into a chamber;
introducing a protective gas to discharge the air in the chamber;
heating the chamber to a temperature ranging from about 600° C. to 900° C. with the protective gas therein and sustaining the temperature;
introducing a gas mixture with a ratio of carbon source gas and carrying gas ranging from 1:30 to 1:3 for 5 to 30 minutes to grow a plurality of strip-shaped carbon nanotube arrays; and
folding the plurality of strip-shaped carbon nanotube arrays along a direction parallel to a surface of the insulating substrate;
connecting a source electrode and a drain electrode with each of the plurality of carbon nanotube layers;
covering the plurality of carbon nanotube layers with an insulating layer; and
applying a plurality of gate electrodes on the insulating layer, each of the plurality of gate electrodes being opposite to and electrically insulated from one of the plurality of carbon nanotube layers.

15. The method of claim 4, wherein the pressing device is a pressure head with a smooth surface.

16. The method of claim 4, wherein the pressing device is a roller-shaped pressure head.

* * * * *